United States Patent
Shiratori et al.

(10) Patent No.: US 8,915,418 B2
(45) Date of Patent: Dec. 23, 2014

(54) ELECTRONIC COMPONENT BONDING METHOD

(71) Applicants: Alpha Design Co., Ltd., Nagano (JP); Tadatomo Suga, Tokyo (JP); Masataka Mizukoshi, Tokyo (JP)

(72) Inventors: Toshiyuki Shiratori, Toumi (JP); Toru Kawasaki, Toumi (JP); Tadatomo Suga, Tokyo (JP); Masataka Mizukoshi, Tokyo (JP)

(73) Assignees: Tadatomo Suga, Tokyo (JP); Masataka Mizukoshi, Tokyo (JP); Alpha Design Co., Ltd., Nagano (JP)

( * ) Notice: Subject to any disclaimer, the term of this patent is extended or adjusted under 35 U.S.C. 154(b) by 0 days.

(21) Appl. No.: 14/208,472

(22) Filed: Mar. 13, 2014

(65) Prior Publication Data

US 2014/0263581 A1    Sep. 18, 2014

(30) Foreign Application Priority Data

Mar. 14, 2013 (JP) .................................. 2013-51679

(51) Int. Cl.
*B23K 31/02* (2006.01)
*H05K 3/32* (2006.01)
*H05K 13/04* (2006.01)

(52) U.S. Cl.
CPC ............... *H05K 3/32* (2013.01); *H05K 13/046* (2013.01)
USPC .................... 228/180.21; 228/214; 228/234.1; 228/248.1

(58) Field of Classification Search
None
See application file for complete search history.

(56) References Cited

U.S. PATENT DOCUMENTS

| 6,555,840 B1* | 4/2003 | Hudson et al. .................. 257/40 |
| 2002/0158568 A1* | 10/2002 | Satake .......................... 313/493 |
| 2003/0038379 A1* | 2/2003 | Kawasaki et al. ............. 257/783 |
| 2005/0061856 A1* | 3/2005 | Maki et al. ................. 228/234.1 |

(Continued)

FOREIGN PATENT DOCUMENTS

| EP | 0475223 B1 * | 10/1997 |
| JP | 2002-353252 A * | 12/2002 |
| JP | 2010-118534 | 5/2010 |
| JP | 2012-89740 | 5/2012 |

OTHER PUBLICATIONS

Machine translation of JP 2012-089740A (no date available).*

*Primary Examiner* — Kiley Stoner
(74) *Attorney, Agent, or Firm* — Greenblum & Bernstein, P.L.C.

(57) ABSTRACT

The present invention ensures a good bonding state between the electrode terminals of electronic components and the electrodes of a substrate, and achieves an increase in productivity and a downsizing of the substrate. The present invention includes: an applying step of applying a metal fine powder paste on each of multiple electrodes that are provided on a substrate; a component placing step of placing multiple electronic components with different heights, on the multiple electrodes, respectively; an organic film placing step of placing an organic film on the multiple electronic components; an organic film compressing step of applying a first pressure to the electronic component side with a pressing member and equalizing the height of the organic film; and a bonding step of applying a second pressure to the electronic component side with a compressing member on heating for a predetermined time and sintering the metal fine powder paste.

13 Claims, 10 Drawing Sheets

(56) References Cited

U.S. PATENT DOCUMENTS

| | | | |
|---|---|---|---|
| 2007/0001591 A1* | 1/2007 | Tanaka | 313/504 |
| 2009/0258142 A1* | 10/2009 | An et al. | 427/255.6 |
| 2010/0219401 A1* | 9/2010 | Bradley et al. | 257/40 |
| 2011/0186981 A1* | 8/2011 | Fukuoka et al. | 257/690 |
| 2011/0266693 A1* | 11/2011 | Simmons-Matthews | 257/774 |
| 2011/0290863 A1* | 12/2011 | Kajiwara et al. | 228/227 |
| 2011/0306182 A1* | 12/2011 | Fukuyo et al. | 438/460 |
| 2012/0192944 A1* | 8/2012 | Aoyama et al. | 136/256 |
| 2012/0267676 A1* | 10/2012 | Satake | 257/99 |
| 2013/0306358 A1* | 11/2013 | Ohmori et al. | 174/251 |

* cited by examiner

ELECTRONIC COMPONENT BONDING METHOD

TECHNICAL FIELD

The present invention relates to a technical field concerned with an electronic component bonding method for bonding the electrode terminals of multiple electronic components to the electrodes of a substrate respectively, by a solid-phase diffusion bonding in which a metal fine powder paste is sintered.

CITATION LIST

Patent Literature

[Patent Literature 1]: Japanese Unexamined Patent Application Publication No. 2010-118534
[Patent Literature 2]: Japanese Unexamined Patent Application Publication No. 2012-89740

BACKGROUND ART

As a method for bonding electronic components such as semiconductor elements to a substrate, there is a bonding method using solder. The bonding method using solder has advantages, for example, in that electronic components can be bonded in a short time, in that solder has high reliability for thermal strain that occurs in connection with temperature change, and in that multiple electronic components can be bonded at one time by reflow.

However, the bonding method using solder has disadvantages, for example, in that it is difficult to bond multiple electrode terminals of electronic components at fine intervals, and in that solder has a low electric conductivity and thermal conductivity compared to silver and the like.

Meanwhile, as a method for bonding electronic components to a substrate, there is a method by solid-phase diffusion bonding, in which a heating or compressing is performed or an ultrasonic vibration is applied so that the bonding is performed (see Japanese Patent Laid-Open No. 2010-118534, for example).

The method by solid-phase diffusion bonding, which is a bonding method utilizing the atom diffusion phenomenon occurring between metals (electrodes) that do not melt by the heating or compressing under certain conditions, is generally performed under the condition of a few hundred degrees Celsius that is lower than the melting point of solder, and allows the temperature in bonding operation to be lowered relative to the bonding method using solder.

As such a method by solid-phase diffusion bonding, for example, there are a method of directly bonding the electrode terminals of electronic components and the electrodes of a substrate by applying a predetermined temperature and pressure, and a method of applying a metal fine powder paste between the electrode terminals of electronic components and the electrodes of a substrate and then bonding them by sintering the metal fine powder paste.

The method by solid-phase diffusion bonding has an advantage of making it possible to ensure a high electric conductivity and thermal conductivity while having a good thermal resistance. Therefore, the solid-phase diffusion bonding is a bonding method that can be particularly used not only in next-generation power semiconductors such as SiC (silicon carbide) and GaN (gallium nitride), which require a good thermal property and electric property, but also in a wide range of fields such as the connection of high-brightness LEDs (Light Emitting Diodes) and the bonding in LSIs (Large Scale Integrations).

Meanwhile, the solid-phase diffusion bonding has a disadvantage that it requires a high pressure, and for sufficiently developing diffusion reaction, requires more time than the bonding time by solder.

By the way, in many cases, multiple electronic components are bonded to a substrate. In bonding of multiple electronic components, the electronic components sometimes have different heights. In such cases, according to a conventional solid-phase diffusion bonding, the individual electronic components are respectively sandwiched between separate heaters, and a predetermined temperature and pressure are applied to each of the individual electronic components for a certain time.

However, the method in which the individual electronic components are sandwiched between separate heaters and a predetermined temperature and pressure are applied for a certain time has problems in that heaters for heating, motors for compressing and the like are required for each of the individual electronic components, resulting in an increase in production costs of a component bonding apparatus (bonder), and in that a lot of time is also required for diffusion reaction, resulting in a low productivity.

Further, in the multiple electronic components to be bonded to the substrate, the parallelisms are not equal as well as the heights. For uniformly compressing the multiple electronic components to bond them to the substrate, advanced controls such as the adjustment of the parallelisms are required, resulting in a decrease in productivity, as well.

Furthermore, the downsizing of electronic equipment and the like in recent years leads to a high requirement for the downsizing of the substrate, and the distance between the electronic components to be bonded to a single substrate, and the pitch between the terminals of the electronic components tend to be shortened. However, a large arrangement space is required in order to arrange heaters for heating each of the individual electronic components, motors for compressing and the like. Therefore, the method in which the individual electronic components are sandwiched between separate heaters and a predetermined temperature and pressure are applied for a certain time has also a problem in that it is difficult to bond the electronic components when the distance between the electronic components or the pitch between the terminals of the electronic components is short, resulting in an obstacle to the downsizing of the substrate.

Meanwhile, as a conventional method in which multiple electronic components with different heights are bonded to a substrate by solid-phase diffusion bonding, there is a method in which the multiple electronic components are arranged in liquid and then are bonded by compressing the multiple electronic components by the hydrostatic pressure of the liquid on heating of the liquid (see Japanese Patent Laid-Open No. 2012-89740, paragraphs 0044, 0046 and others).

SUMMARY OF THE INVENTION

Problems to be Solved by the Invention

The method in which multiple electronic components are compressed and bonded by the hydrostatic pressure of liquid described above shortens the time for diffusion reaction and does not require advanced controls such as the adjustment of the parallelisms of the electronic components for the substrate, resulting in an increase in productivity. Further, it allows the electronic components to be bonded, for example, when the pitch between the terminals is short, and contributes to the downsizing of the substrate.

However, in the method in which multiple electronic components are compressed and bonded by the hydrostatic pressure of liquid, since the pressure to be applied to the electronic components is hydrostatic pressure, it is impossible to press the electrode terminals of the electronic components onto the electrodes of the substrate at a sufficient force, and there is a possibility that it is impossible to ensure a good bonding state between the electrode terminals of the electronic components and the electrodes of the substrate.

Hence, an object of the present invention is to overcome the above problems, and to ensure a good bonding state between the electrode terminals of the electronic components and the electrodes of the substrate, and achieve an increase in productivity and a downsizing of the substrate.

Solutions to the Problems

Firstly, an electronic component bonding method according to the present invention includes: an applying step of applying a metal fine powder paste on each of multiple electrodes that are provided on a substrate; a component placing step of placing multiple electronic components in positional alignment with the multiple electrodes respectively, the multiple electronic components including at least two electronic components that have different heights; an organic film placing step of placing an organic film on the multiple electronic components, the organic film having a thickness greater than a height difference between the highest electronic component and the lowest electronic component of the multiple electronic components; an organic film compressing step of pressing a pressing surface of a pressing member against the organic film, applying a first pressure to the electronic component side with the pressing member, and equalizing a height of a pressed surface of the organic film, the pressing surface having a planar shape, the pressing member being heated to a predetermined temperature, the pressed surface being pressed by the pressing surface; and a bonding step of pressing a compressing surface of a compressing member against the pressed surface, applying a second pressure to the electronic component side with the compressing member on heating for a predetermined time, and sintering the metal fine powder paste to bond electrode terminals of the multiple electronic components to the electrodes of the substrate respectively, the compressing surface having a planar shape.

Thereby, in a state in which the compressing surface of the compressing member is pressed against the pressed surface of the organic film whose height has been equalized by the pressing member, the second pressure is applied to the electronic component side by the compressing member, and therewith a heating is performed for a predetermined time.

Secondly, in the above electronic component bonding method according to the present invention, it is preferable to include, as a post-step of the bonding step, a stripping step of detaching the compressing member and stripping the organic film from the multiple electronic components.

Thereby, it is possible to avoid the influence of impurities, gas and the like that can be generated from the organic film, on the electronic components.

Thirdly, in the above electronic component bonding method according to the present invention, it is preferable to include, between the component placing step and the organic film placing step, a strippable film placing step of placing a strippable film on the multiple electronic components, and to place the organic film on the multiple electronic components through the strippable film.

Thereby, the organic film is stripped from the electronic components, along with the strippable film.

Fourthly, in the above electronic component bonding method according to the present invention, it is preferable that a contacting surface of the organic film with the electronic component be larger than a contacting surface of the electronic component with the organic film, and when the first pressure is applied with the pressing member in the organic film compressing step, at least part of a side surface of the electronic component be covered with the organic film, and therewith at least part of the metal fine powder paste be pressed by the organic film.

Thereby, the metal fine powder paste is pressed by the organic film covering the side surface of the electronic component.

Fifthly, in the above electronic component bonding method according to the present invention, it is preferable that the organic film be composed of a first layer and a second layer that is positioned closer to the electronic component than the first layer, and a glass transition point of the first layer be higher than a glass transition point of the second layer.

Thereby, when the first pressure is applied to the organic film in the organic film compressing step, the second layer is deformed more largely than the first layer.

Sixthly, in the above electronic component bonding method according to the present invention, it is preferable that at least part of the pressing member be formed of a transparent material, an ultraviolet curable film be used as the organic film, and in the organic film compressing step, the organic film be irradiated with ultraviolet rays by transmission through the pressing member so that the organic film is cured.

Thereby, the curing of the organic film is rapidly performed by the irradiation of ultraviolet rays.

Seventhly, in the above electronic component bonding method according to the present invention, it is preferable that the pressing member be used as the compressing member, and the pressing surface be used as the compressing surface.

Thereby, it is unnecessary that a dedicated pressing member and compressing member are provided separately.

Advantageous Effects of the Invention

In an electronic component bonding method according to the present invention, the multiple electronic components with different heights are pressed at one time by the compressing member through the organic film, and then a pressure is applied while a heating is performed for a predetermined time. Therefore, it is possible to ensure a good bonding state between the electrode terminals of the electronic components and the electrodes of the substrate, and achieve an increase in productivity and a downsizing of the substrate.

DESCRIPTION OF EMBODIMENTS

Hereinafter, embodiments of an electronic component bonding method according to the present invention will be described with reference to the accompanying drawings.
<Schematic Configuration of Component Bonding Apparatus>

Figure 1:
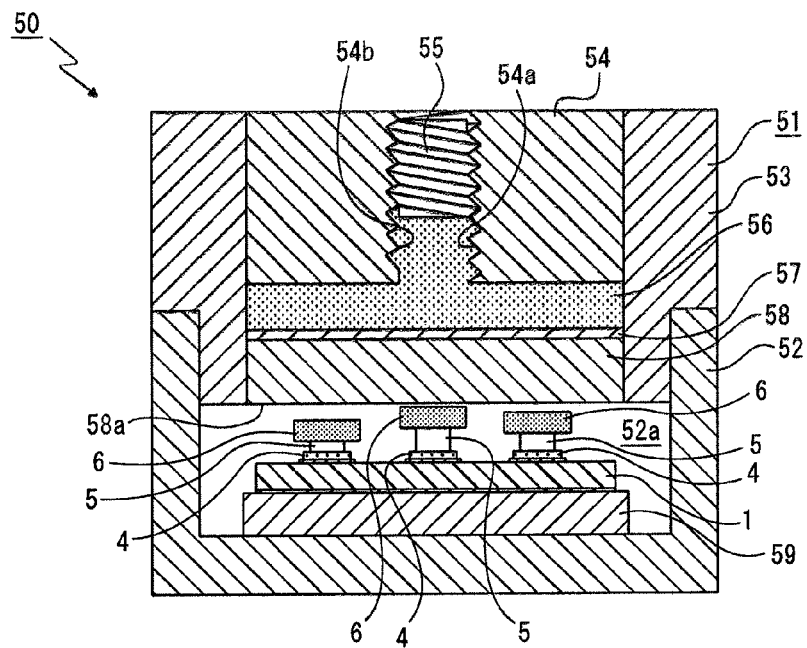
FIG. 1 is a schematic cross-sectional diagram of a component bonding apparatus, and shows an embodiment of an electronic component bonding method according to the present invention, along with FIG. 2 to FIG. 20.

First, the schematic configuration of a component bonding apparatus (bonder) that bonds electronic components to a substrate will be described (see FIG. 1).

A component bonding apparatus 50 includes a base case 51, and necessary parts that are disposed in the interior of the base case 51. The base case 51 includes an underside base 52 that is opened upwardly, an upside base 53 that has a vertically-pierced cylinder shape, and an inside base 54 that is provided in the interior of the upside base 53.

The internal space of the underside base 52 is formed as an arrangement space 52a. A substrate, electronic components and the like, which will be described later, are arranged in the arrangement space 52a of the underside base 52, and at least some of bonding operations of the electronic components to the substrate are performed in the arrangement space 52a.

The upside base 53, whose lower end is combined with the upper end of the underside base 52, is detachable from the underside base 52.

The inside base 54 is formed in a vertically-pierced cylinder shape, and is attached to the upside base 53 so as to seal the upper portion in the internal space of the upside base 53. A screwing groove 54b is formed on an inner circumferential surface 54a of the inside base 54, and a pressure adjusting screw 55, which functions as a pressure adjusting valve, is screwed to the screwing groove 54b.

Oil 56 is enclosed in a space ranging from the inside of the upside base 53 to the inside of the inside base 54. The oil 56 is enclosed so as to be sealed from the lower side by a sealing member 57, sealed from the lateral side by the upside base 53, and sealed from the upper side by the pressure adjusting screw 55.

The sealing member 57, whose outer circumference is attached to the inner circumference of the upside base 53, is deformable depending on the pressure (oil pressure) of the oil 56. As the sealing member 57, for example, a rubber member, a thin film member of stainless steel, or the like is used.

In the inside of the upside base 53, a compressing head heater 58, which functions as a pressing member and a compressing member, is supported so as to be able to move up and down. To the compressing head heater 58, heat is transferred from a heating apparatus not shown in the figure, and the heating condition of the compressing head heater 58 is controlled by a thermocouple not shown in the figure, or the like. The compressing head heater 58, whose lower surface is formed as a pressing surface 58a formed in a planar shape, is arranged such that the upper surface contacts with the lower surface of the sealing member 57. Here, the component bonding apparatus 50 may control the heating condition of the compressing head heater 58 by transferring heat to the oil 56 and thereby transferring the heat to the compressing head heater 58 through the oil 56 and the sealing member 57.

On the bottom surface portion of the underside base 52, a stage heater 59 is arranged under the compressing head heater 58. Similarly to the compressing head heater 58, heat is transferred from a heating apparatus to the stage heater 59, and the heating condition of the stage heater 59 is controlled by a thermocouple or the like.

Figure 2:
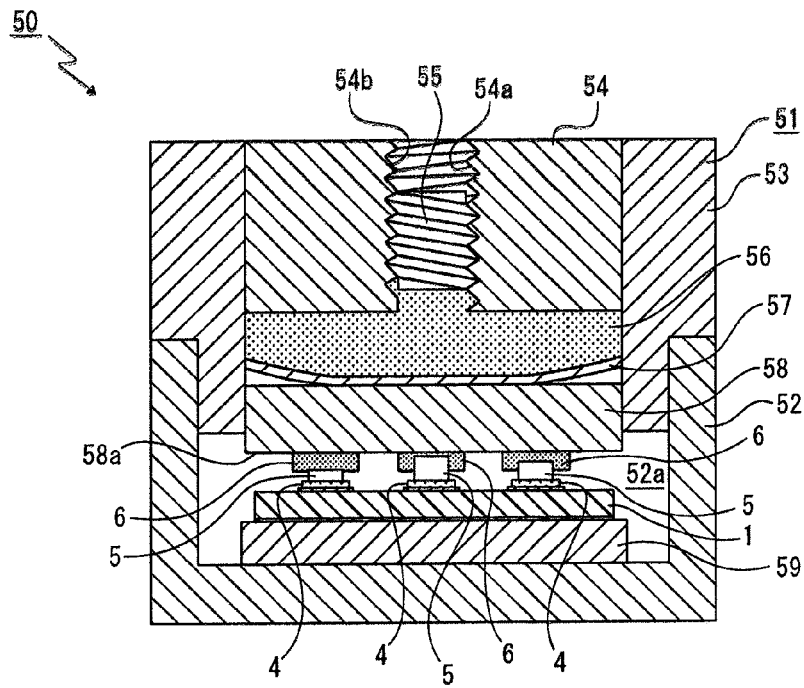
FIG. 2 is a schematic cross-sectional diagram of the component bonding apparatus that shows a state in which a compressing head heater has been moved.

In the component bonding apparatus 50 having the above configuration, once the pressure adjusting screw 55 is rotated by a driving apparatus, the pressure (oil pressure) of the oil 56 is changed depending on the rotation direction and rotation amount of the pressure adjusting screw 55, the pressure of the oil 56 is transferred to the sealing member 57 so that the sealing member 57 is deformed, and then the compressing head heater 58 is moved vertically relative to the upside base 53 (see FIG. 2). Therefore, the vertical position of the pressing surface 58a of the compressing head heater 58 is changed depending on the rotation direction and rotation amount of the pressure adjusting screw 55.

As described above, a substrate, electronic components and the like are arranged in the arrangement space 52a of the underside base 52. The compressing head heater 58 is moved vertically, and thereby, as described later, the electronic components and the like are compressed by the compressing head heater 58.

Here, although an example in which the compressing head heater 58 is moved by the change in the oil pressure associated with the rotation of the pressure adjusting screw 55 has been described above, it is allowable to be configured such that the oil pressure is changed by the driving shaft movement or the like that is caused by the rotation of means other than the pressure adjusting screw 55, for example, a piston or a handle.

The moving means of the compressing head heater 58 is not limited to the change in the oil pressure, and for example, it is possible to be configured such that the compressing head heater 58 is moved by mechanical driving means with a gear, a motor or the like, or by the change in air pressure.

<Electronic Component Bonding Method>

Hereafter, a procedure of a bonding method of electronic components to a substrate will be described (see FIG. 3 to FIG. 14). The bonding of electronic components to a substrate is performed by a solid-phase diffusion bonding that utilizes the atom diffusion phenomenon occurring by heating or compressing, and in this solid-phase diffusion bonding, a metal fine powder paste is used.

Here, predetermined steps, of the steps for electrode components to a substrate, are performed in the component bonding apparatus 50, but in the following description for the steps, only the compressing head heater 58 and stage heater 59 of the component bonding apparatus 50 are shown as necessary, for simplification of the description.

Figure 3:
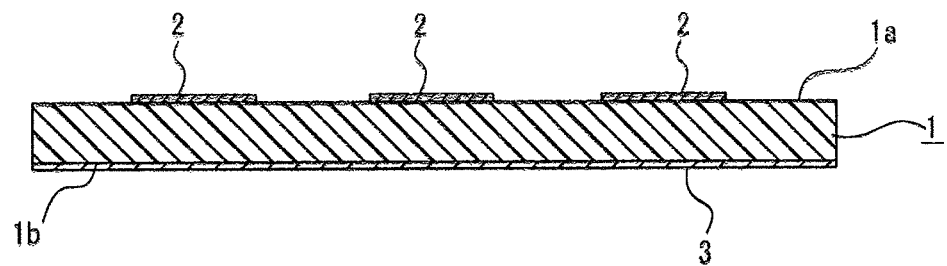
FIG. 3 is an enlarged cross-sectional diagram showing a state in which a substrate has been prepared, and shows a procedure of an electronic component bonding method, along with FIG. 4 to FIG. 14.

First, a substrate 1 is prepared and is placed on a work table not shown in the figure (see FIG. 3). On the substrate 1, a driving circuit not shown in the figure is formed, and on an upper surface 1a of the substrate 1, multiple electrodes 2, 2, . . . that are connected with the driving circuit are provided. On a lower surface 1b of the substrate 1, a conductive part 3 that is connected with the driving circuit is provided. The electrodes 2, 2, . . . and the conductive part 3 are formed of a predetermined metal material, for example, gold, silver, copper, tin, nickel, zinc, antimony, bismuth, indium, an alloy thereof or the like.

Figure 4:
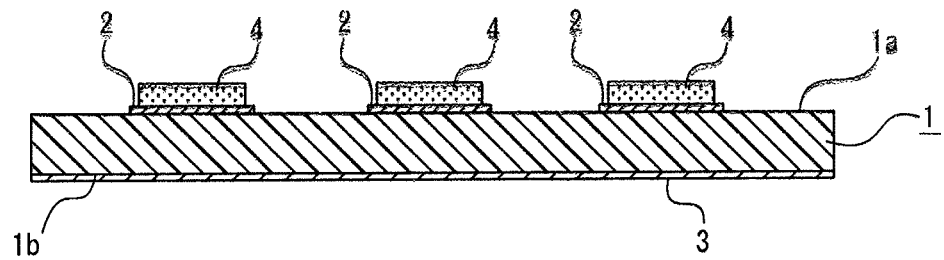
FIG. 4 is an enlarged cross-sectional diagram showing an applying step.

Next, an applying step is performed (see FIG. 4). In the applying step, metal fine powder pastes 4, 4, . . . are applied on the electrodes 2, 2, . . . provided on the substrate 1, respectively. The metal fine powder paste 4, which is used as a die attach material, is formed of, for example, gold, silver, copper, tin, nickel, zinc, antimony, bismuth, indium, an alloy thereof or the like, which are the same material as the electrode 2.

Thus, the metal fine powder paste 4 is formed of gold, silver, copper, tin, nickel, zinc, antimony, bismuth, indium, an alloy thereof or the like, and therefore it is possible to use a material having a high bondability with the electrode 2 as the metal fine powder paste 4, and to achieve an increase in design flexibility and an enlargement of the range of material choices.

Figure 5:
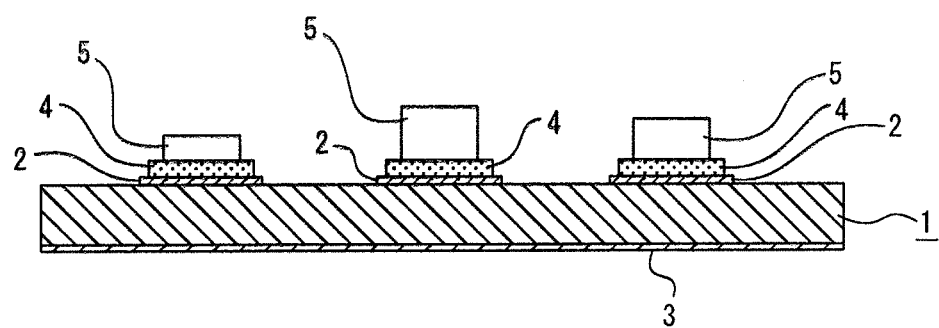
FIG. 5 is an enlarged cross-sectional diagram showing a component placing step.

Next, a component placing step is performed (see FIG. 5). In the component placing step, electronic components 5, 5, . . . are placed in positional alignment with the electrodes 2, 2, . . . , respectively. At this time, the electronic components 5, 5, . . . are placed on the electrodes 2, 2, . . . through the metal fine powder pastes 4, 4, . . . , respectively.

The electronic components 5, 5, . . . include at least two electronic components 5, 5 with different heights, and, on the lower surfaces, have multiple electrode terminals not shown in the figure.

Since some of the electronic components 5, 5, . . . have different heights as described above, the positions of the upper surfaces of the electronic components 5, 5, . . . are different depending on the heights of the electronic components 5, 5, . . . , in the state in which the electronic components 5, 5, . . . have been placed on the electrodes 2, 2, . . . in positional alignment therewith, respectively.

Figure 6:
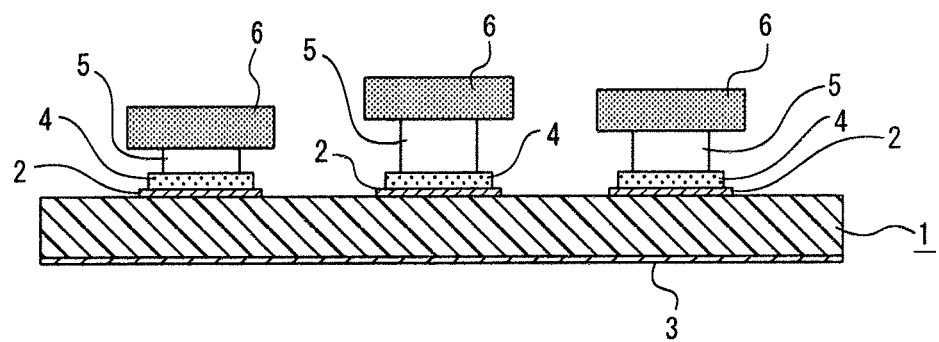
FIG. 6 is an enlarged cross-sectional diagram showing an organic film placing step.

Next, an organic film placing step is performed (see FIG. 6). In the organic film placing step, organic films 6, 6, . . . are placed on the upper surfaces of the electronic components 5, 5, . . . , respectively. As the organic film 6, for example, a film formed of a thermoplastic resin material is used.

The organic films 6, 6, . . . have a thickness that is greater than the height difference between the highest electronic component 5 and lowest electronic component 5 of the electronic components 5, 5, . . . , and the sizes of the lower surfaces are greater than the sizes of the upper surfaces of the electronic components 5, 5, . . . . Therefore, in the state in which the organic films 6, 6, . . . have been placed on the electronic components 5, 5, . . . , respectively, the outer-circumference-side portions of the organic films 6, 6, . . . protrude laterally from the electronic components 5, 5, . . . , respectively. Further, in the state in which the organic films 6, 6, . . . have been placed on the electronic components 5, 5, . . . , the positions of the upper surfaces of the organic films 6, 6, . . . are different depending on the heights of the electronic components 5, 5, . . . . The upper surfaces of the organic films 6, 6, . . . are pressed surfaces 6a, 6a, . . . , respectively.

Figure 7:
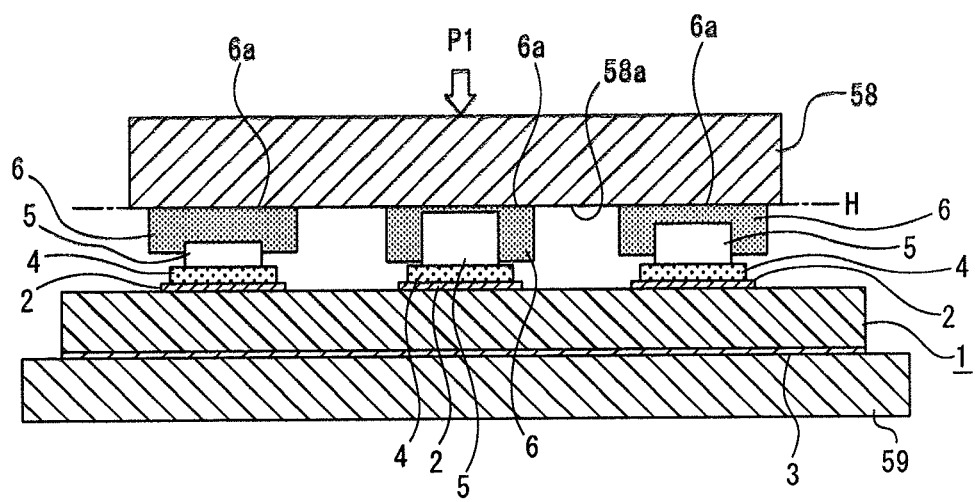
FIG. 7 is an enlarged cross-sectional diagram showing an organic film compressing step.

In the state in which, as described above, the organic film 6, 6, . . . have been placed on the electronic components 5, 5, . . . respectively, the substrate 1 is placed on the stage heater 59 in the arrangement space 52a of the component bonding apparatus 50, and then an organic film compressing step is performed (see FIG. 7). In the organic film compressing step, all the organic films 6, 6, . . . are downwardly pressed at one time by the compressing head heater 58, which functions as a pressing member, and a first pressure P1 is applied to the organic films 6, 6, . . . . At this time, for promoting the deformation (softening) of the organic films 6, 6, . . . , the compressing head heater 58 and the stage heater 59 are heated. In the compressing head heater 58, the lower surface is formed as a planar pressing surface 58a.

When the compressing head heater 58 and the stage heater 59 are heated in this way, the temperature of the organic films 6, 6, . . . becomes higher than the glass transition point, but is lower than a temperature when the compressing head heater 58 and the stage heater 59 are heated in a bonding step described later. Therefore, the organic films 6, 6, . . . are deformed by the heating, but the metal fine powder pastes 4, 4, . . . are not sintered at this point.

The pressing surface 58a of the compressing head heater 58 is pressed against the pressed surfaces 6a, 6a, . . . of the organic films 6, 6, . . . , and is moved downwardly by the rotation of the pressure adjusting screw 55. Thereby, the first pressure P1 is applied to the organic films 6, 6, . . . .

Figure 8:
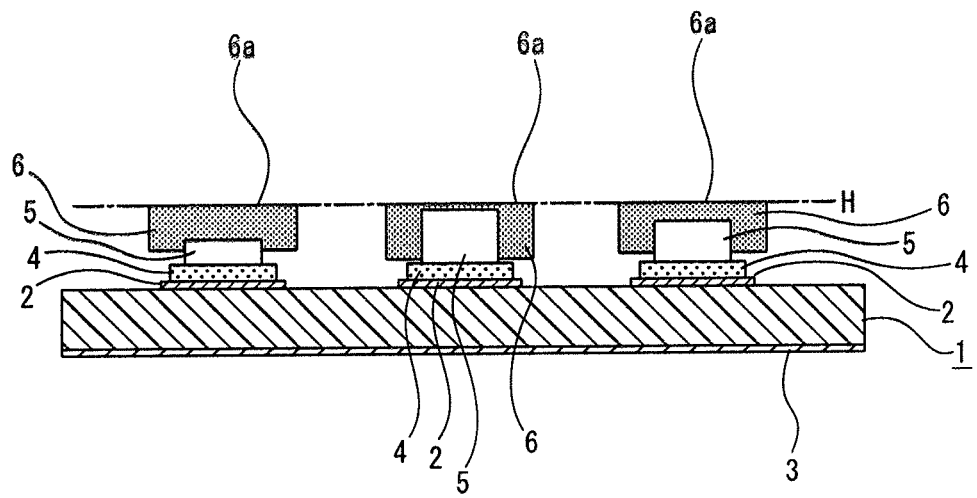
FIG. 8 is an enlarged cross-sectional diagram showing a state in which a first pressure applied to organic films by the compressing head heater has been released.

By applying the first pressure P1 to the organic films 6, 6, . . . with the compressing head heater 58, the organic films 6, 6, . . . are squashed and deformed so that the heights of the pressed surfaces 6a, 6a, . . . of the multiple organic films 6, 6, . . . , against which the pressing surface 58a is pressed, are equalized (see H shown in FIG. 7 and FIG. 8).

At this time, since, as described above, the thickness of the organic films 6, 6, . . . is greater than the height difference between the highest electronic component 5 and lowest electronic component 5 of the electronic components 5, 5, . . . , all the organic films 6, 6, . . . are surely squashed by the compressing head heater 58, and the heights of the pressed surfaces 6a, 6a, . . . of the organic films 6, 6, . . . are surely equalized.

Further, since the sizes of the lower surfaces of the organic films 6, 6, . . . are greater than the sizes of the upper surfaces of the electronic components 5, 5, . . . , at least parts of the side surfaces of the electronic components 5, 5, . . . are covered with respective parts of the organic films 6, 6, . . . , in the state in which the organic films 6, 6, . . . have been squashed by the compressing head heater 58. Therefore, the parts of the organic films 6, 6, . . . that cover at least parts of the side surfaces of the electronic components 5, 5, . . . are covering parts 6b, 6b, . . . , respectively.

In addition, since the thickness of the organic films 6, 6, ... is greater than the height difference between the highest electronic component 5 and lowest electronic component 5 of the electronic components 5, 5, . . . , respective parts of the organic films 6, 6, . . . squashed by the compressing head heater 58 remain between the upper surfaces of all the electronic components 5, 5, . . . and the pressing surface 58a of the compressing head heater 58. Therefore, the pressing surface 58a of the compressing head heater 58 does not contact with the electronic components 5, 5, . . . , and it is possible to prevent unnecessary loads from being applied to the electronic components 5, 5, . . . , and to prevent the electronic components 5, 5, . . . from being damaged or scratched.

Furthermore, since all the organic films 6, 6, . . . are downwardly pressed at one time by the compressing head heater 58 so that the heights of the pressed surfaces 6a, 6a, . . . are equalized, advanced controls such as the adjustment of the parallelism for each of the electronic components 5, 5, . . . are not required.

Subsequently, the compressing head heater 58 is moved upwardly by the rotation of the pressure adjusting screw 55, and the compressing head heater 58 departs upwardly from the organic films 6, 6, . . . so that the first pressure P1 applied to the organic films 6, 6, . . . by the compressing head heater 58 is released (see FIG. 8). At this time, for example, the substrate 1 with the electronic components 5, 5, . . . placed and the like may be temporarily taken out from the arrangement space 52a of the component bonding apparatus 50, to be cooled. Alternatively, the heating by the compressing head heater 58 and the stage heater 59 is stopped, and thereby the substrate 1 and the like may be cooled without being taken out from the arrangement space 52a.

By such a cooling, the organic films 6, 6, . . . formed of a thermoplastic resin material are crystallized and cured, and then the proceeding to the next step becomes possible.

Figure 9:
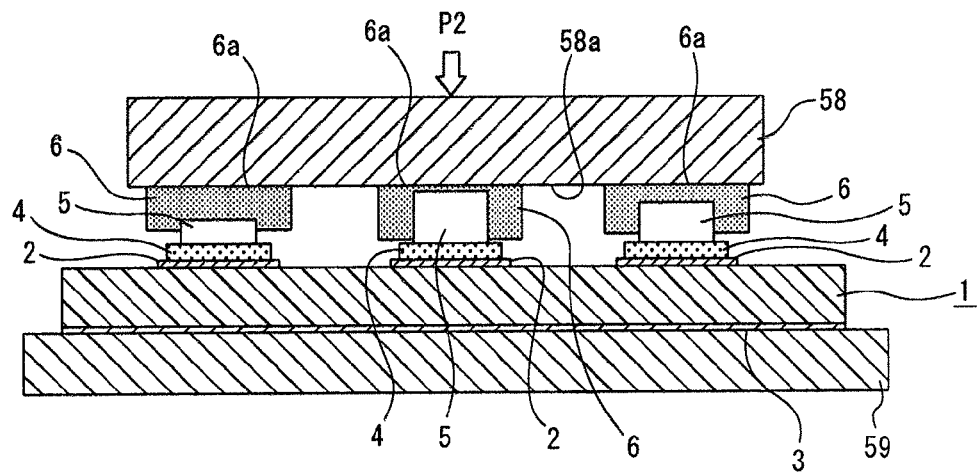
FIG. 9 is an enlarged cross-sectional diagram showing a bonding step.

Next, a bonding step is performed (see FIG. 9). In the bonding step, in the case where the substrate 1 and the like are taken out from the arrangement space 52a of the component bonding apparatus 50, the substrate 1 and the like are again placed on the stage heater 59 in the arrangement space 52a. Here, in the bonding step, it is possible that the substrate 1 and the like are placed in a separate compressing apparatus from the component bonding apparatus 50, but, in the following, an example in which the substrate 1 and the like are again placed on the stage heater 59 in the arrangement space 52a will be shown.

In the bonding step, a second pressure P2 is applied to the organic films 6, 6, . . . by the compressing head heater 58, which functions as a compressing member. The compressing head heater 58 presses the pressing surface 58a against the pressed surfaces 6a, 6a, . . . of the organic films 6, 6, . . . , and is moved downwardly by the rotation of the pressure adjusting screw 55. Thereby, the second pressure P2 is applied to the organic films 6, 6, . . . .

At this time, for sintering the metal fine powder pastes 4, 4, . . . that are respectively applied on the electrodes 2, 2, . . . of the substrate 1, the compressing head heater 58 and the stage heater 59 are heated with the above second pressure P2 applied.

Figure 10:
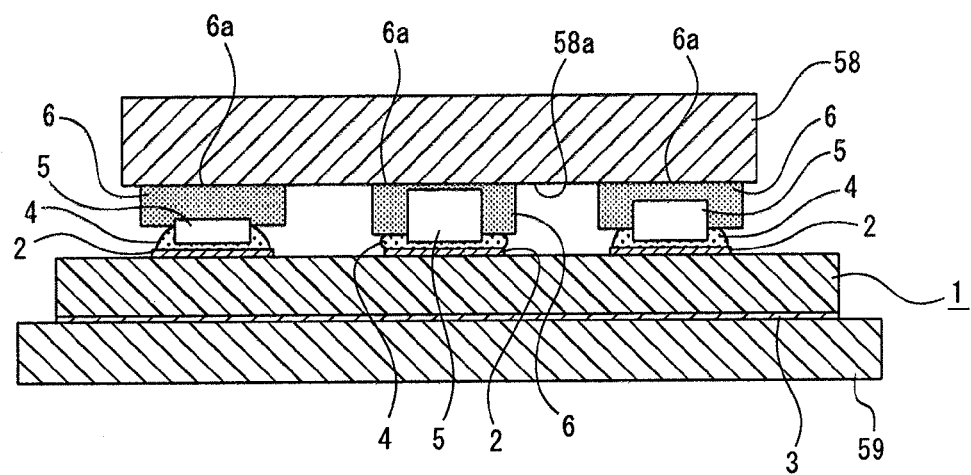
FIG. 10 is an enlarged cross-sectional diagram showing a state in which the electrode terminals of electronic components have been bonded to the electrodes of the substrate, respectively.

By the heating of the compressing head heater 58 and the stage heater 59, the metal fine powder pastes 4, 4, . . . are sintered so that the electrode terminals of the electronic components 5, 5, . . . are respectively bonded to the electrodes 2, 2, . . . of the substrate 1 by solid-phase diffusion (see FIG. 10).

Figure 11:
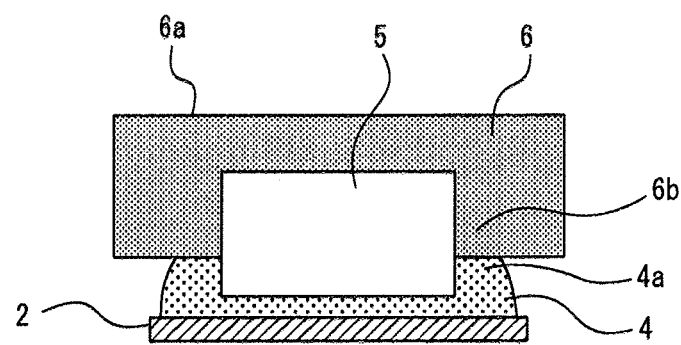
FIG. 11 is an enlarged cross-sectional diagram showing a state in which part of a metal fine powder paste has risen up while going around the side surface of the electronic component, when the electrode terminal of the electronic component has been bonded to the electrode of the substrate.

In the state in which the metal fine powder paste 4 has been sintered so that the electrode terminal of the electronic component 5 has been bonded to the electrode 2 of the substrate 1, as shown in FIG. 11, a part 4a of the metal fine powder paste 4 has risen up while going around the lower end side on the side surface (outer circumferential surface) of the electronic component 5, and covers the circumference of the lower end on the side surface of the electronic component 5. At this time, at least part of the side surface of the electronic component 5 is covered with the covering part 6b of the organic film 6, and the part 4a of the metal fine powder paste 4, which has risen up while going around the lower end side on the side surface of the electronic component 5, contacts with the covering part 6b of the organic film 6 and is pressed from the upper side by the covering part 6b.

As described above, when the first pressure P1 is applied by the pressing member 58 in the organic film compressing step, at least parts of the side surfaces of the electronic components 5, 5, . . . are covered with the covering parts 6b, 6b, . . . of the organic films 6, 6, . . . , and thereby, in the bonding step, the parts 4a, 4a, . . . of the metal fine powder pastes 4, 4, . . . are pressed by the covering parts 6b, 6b, respectively.

Therefore, it is possible to prevent the peeling of the metal fine powder pastes 4, 4, . . . from the electrodes 2, 2, . . . , and to ensure a good bonding state between the electrode terminals of the electronic components 5, 5, . . . and the electrodes 2, 2, . . . of the substrate 1.

An example in which the compressing head heater 58 to function as a pressing member in the organic film compressing step is used as a compressing member in the bonding step has been described above. Therefore, by using the compressing head heater 58 as a pressing member and a compressing member in this way, it is unnecessary to provide a dedicated pressing member and compressing member separately, and it is possible to achieve a shortening of the operation time in the bonding operation for the electronic components 5, 5, . . . , and a cost reduction by a decrease in component counts.

Figure 12:
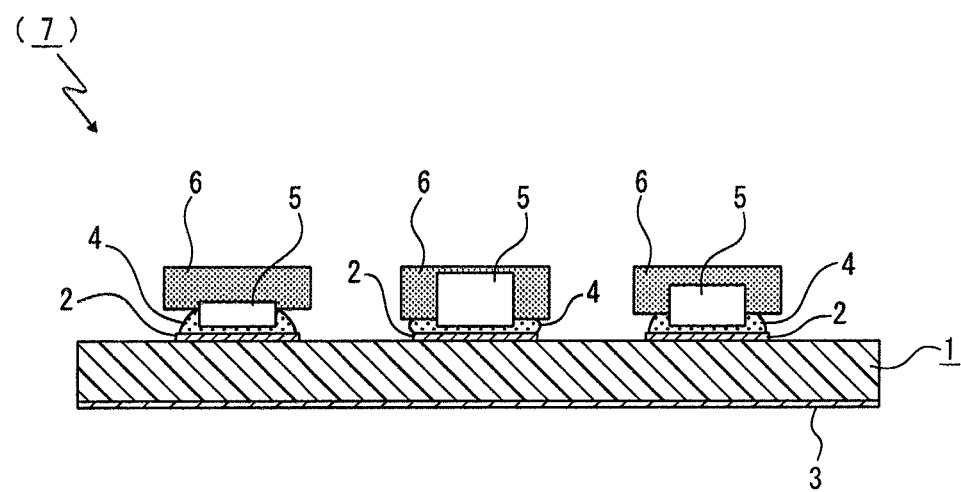
FIG. 12 is an enlarged cross-sectional diagram showing a state in which a second pressure applied to the organic films by the compressing head heater has been released.

Subsequently, the compressing head heater 58 is moved upwardly by the rotation of the pressure adjusting screw 55, and the compressing head heater 58 departs upwardly from the organic films 6, 6, . . . so that the second pressure P2 applied to the organic films 6, 6, . . . by the compressing head heater 58 is released (see FIG. 12). At this time, for example, the substrate 1 with the electronic components 5, 5, . . . placed and the like may be taken out from the arrangement space 52a of the component bonding apparatus 50, to be cooled. Alternatively, the heating by the compressing head heater 58 and the stage heater 59 is stopped, and thereby the substrate 1 and the like may be cooled without being taken out from the arrangement space 52a.

Figure 13:
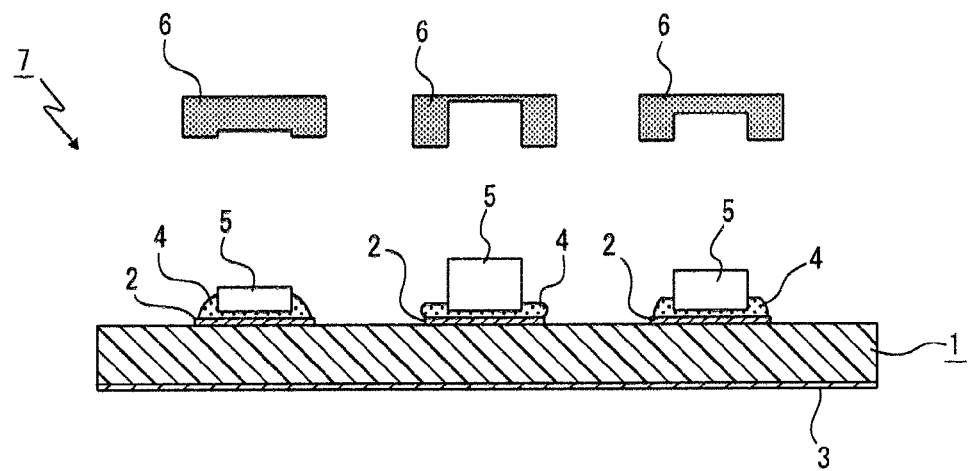
FIG. 13 is an enlarged cross-sectional diagram showing a stripping step.

Next, a stripping step is performed (see FIG. 13). In the stripping step, the organic films 6, 6, . . . squashed by the compressing head heater 58 are stripped from the electronic components 5, 5, . . . , respectively.

Thus, after the bonding step, the organic films 6, 6, . . . are stripped from the electronic components 5, 5, . . . , in the stripping step. Thereby, it is possible to avoid the influence of impurities, gas and the like that can be generated from the organic films 6, 6, . . . , on the electronic components 5, 5, . . . , and to ensure a good driving state of the electronic components 5, 5, . . . .

Here, when there is no possibility that the organic films 6, 6, . . . exert influence on the electronic components 5, 5, . . . , or when the influence is low and the electronic components 5, 5, . . . can ensure a good driving state, the stripping step can be omitted. In this case, since the stripping step is not performed, it is possible to shorten the operation time in the bonding operation for the electronic components 5, 5, . . . , and to achieve an increase in productivity.

As described above, the respective steps are performed, and thereby the bonding of the electronic components 5, 5, . . . to the substrate 1 is completed so that a circuit substrate 7 is formed.

Here, although an example in which films formed of a thermoplastic resin material is used as the organic films 6, 6, . . . has shown above, films formed of a thermosetting resin material can be also used as the organic films 6, 6, . . . , for example. In the case where the films formed of a thermosetting resin material are used as the organic films 6, 6, . . . , in the compressing step for applying the first pressure P1 to the organic films 6, 6, . . . , the heated compressing head heater 58 and stage heater 59 transfer the heat, and thereby the organic films 6, 6, . . . are cured. Therefore, after the compressing is performed, the organic films 6, 6, . . . do not need to be cooled for curing.

Therefore, it is possible to shorten the operation time in the bonding operation for the electronic components 5, 5, . . . , and to achieve an increase in productivity.

Further, as the organic films 6, 6, . . . , for example, films formed of an ultraviolet curable resin material can be also used.

Figure 14:
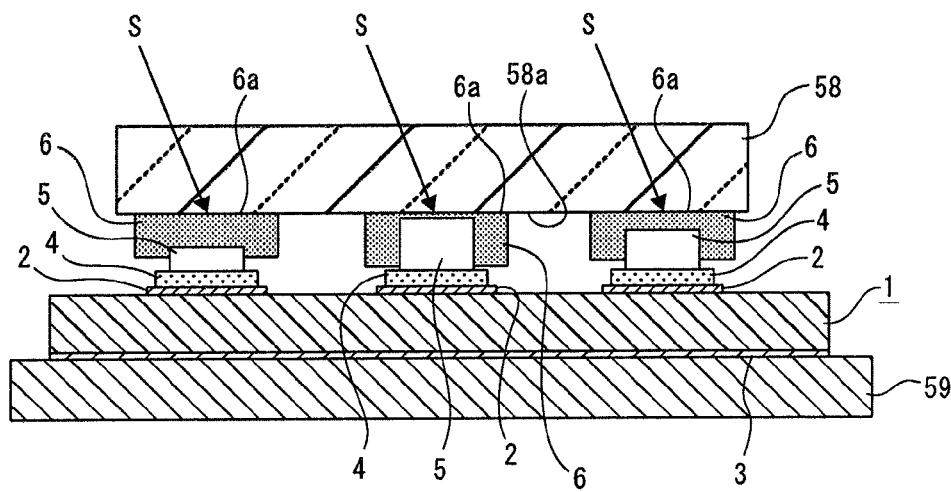
FIG. 14 is an enlarged cross-sectional diagram showing a state in which the organic films are cured by ultraviolet rays.

In the case where the films formed of an ultraviolet curable resin material are used as the organic films 6, 6, . . . , a part or whole of the compressing head heater 58 to function as a compressing member is formed of a transparent material that does not melt by ultraviolet rays, for example, a transparent glass material (see FIG. 14). In this case, after the organic films 6, 6, . . . are deformed by the compressing head heater 58 in the compressing step, the organic films 6, 6, . . . are irradiated with ultraviolet rays S, S, . . . by transmittance through the compressing head heater 58 so that the organic films 6, 6, . . . are cured, and thereby the proceeding to the next step becomes possible.

Thus, the films formed of an ultraviolet curable resin material are used as the organic films 6, 6, . . . , and the organic films 6, 6, . . . are cured by the ultraviolet rays S, S, . . . . Thereby, it is possible to rapidly perform the curing of the organic films 6, 6, . . . , and to achieve an increase in productivity by the shortening of the curing time.

The organic film 6 may be formed as a two-layer structure and may be configured such that the glass transition point of a first layer that is the upper side is higher than the glass transition point of a second layer that is the lower side.

By such an organic film 6 having a two-layer structure in which the glass transition point of the first layer is higher than the glass transition point of the second layer, when the first pressure is applied to the organic film 6 in the organic film compressing step, the second layer can more easily deform than the first layer, and part of the squashed organic films 6, 6, . . . can easily remain between the upper surface of the electronic component 5 and the pressing surface 58*a* of the compressing head heater 58. This allows for an achievement of a load reduction to the electronic component 5 at the time of the compressing.

Here, an example in which the organic films 6, 6, . . . are placed on the upper surfaces of the electronic components 5, 5, . . . respectively has been described above, but, for example, when the electronic components 5, 5, . . . at adjacent positions have the same height, or when the height difference is small, a single organic film 6 may be placed across the multiple electronic components 5, 5, . . . .

<Method Using Strippable Film>

Next, a bonding method for the electronic components 5, 5, . . . using a strippable film will be described (see FIG. 15 to FIG. 20). The bonding method using a strippable film is a method in which a strippable film placing step is added between the above component placing step and organic film placing film, and the other steps are roughly the same as the above described contents. Therefore, in the following, only matters different from the above matters in the respective steps will be described in detail.

Figure 15:
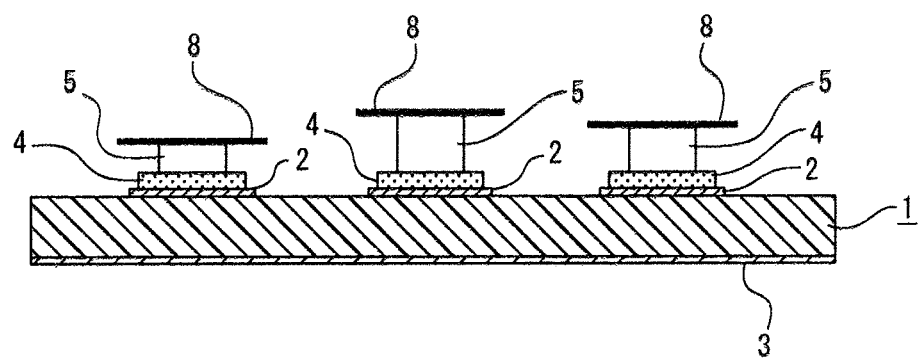
FIG. 15 is an enlarged cross-sectional diagram showing a strippable film placing step, and shows a procedure of an electronic component bonding method using strippable films, along with FIG. 16 to FIG. 20.

After the applying step and the component placing step are performed, next, the strippable film placing step is performed (see FIG. 15). In the strippable film placing step, strippable films 8, 8, . . . are placed on the upper surfaces of the electronic components 5, 5, . . . , respectively. As the strippable film 8, for example, a metal film or a film of polyimide or the like, which has a higher strippable property for the electronic component 5 than the organic film 6, is used.

The strippable films 8, 8, . . . are larger than the sizes of the upper surfaces of the electronic components 5, 5, . . . , respectively, and in the state in which the strippable films 8, 8, . . . have been placed on the electronic components 5, 5, . . . respectively, the outer-circumference-side portions of the strippable films 8, 8, . . . protrude laterally from the electronic components 5, 5, . . . , respectively.

Figure 16:
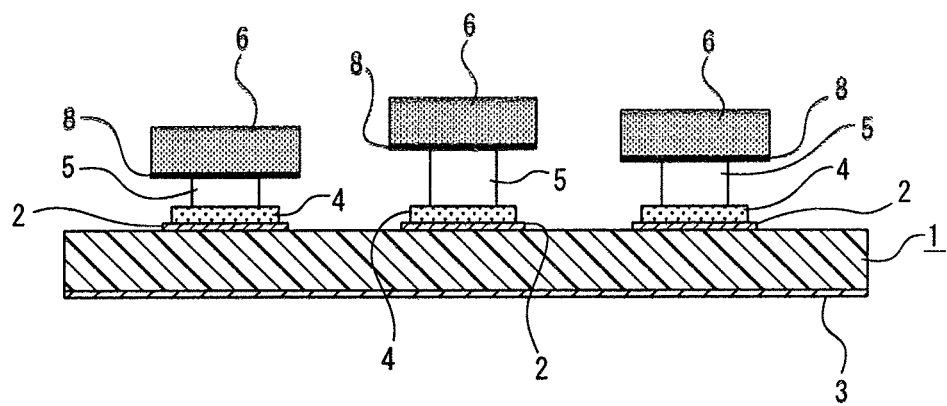
FIG. 16 is an enlarged cross-sectional diagram showing the organic film placing step.

Next, the organic film placing step is performed (see FIG. 16). In the organic film placing step, the organic films 6, 6, . . . are placed on the upper surfaces of the strippable films 8, 8, . . . , respectively.

Figure 17:
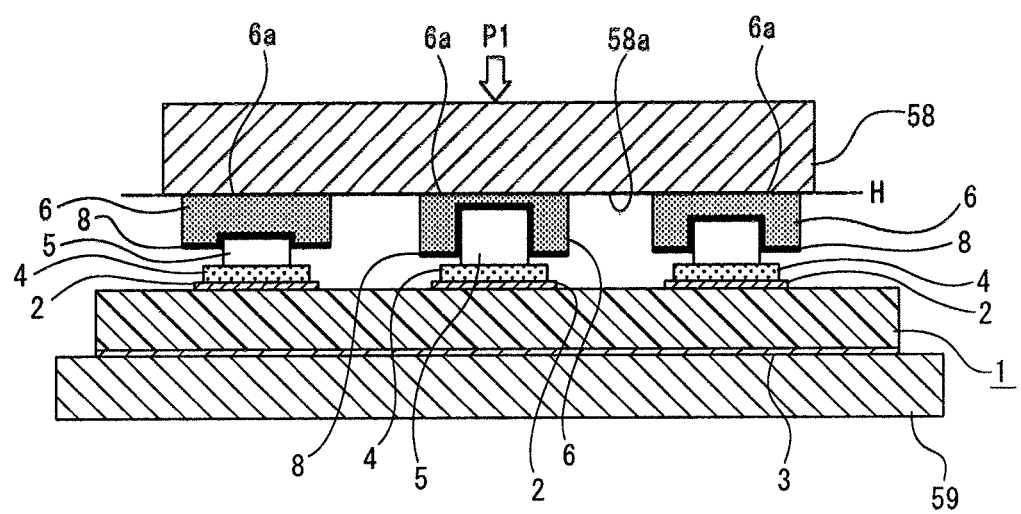
FIG. 17 is an enlarged cross-sectional diagram showing the organic film compressing step.

Next, the organic film compressing step is performed (see FIG. 17). In the organic film compressing step, all the organic films 6, 6, . . . and all the strippable films 8, 8, . . . are downwardly pressed at one time by the compressing head heater 58, which functions as a pressing member, and the first pressure P1 is applied to the organic films 6, 6, . . . and the strippable films 8, 8, . . . . At this time, for promoting the deformation (softening) of the organic films 6, 6, . . . and the strippable films 8, 8, . . . , the compressing head heater 58 and the stage heater 59 are heated.

Figure 18:
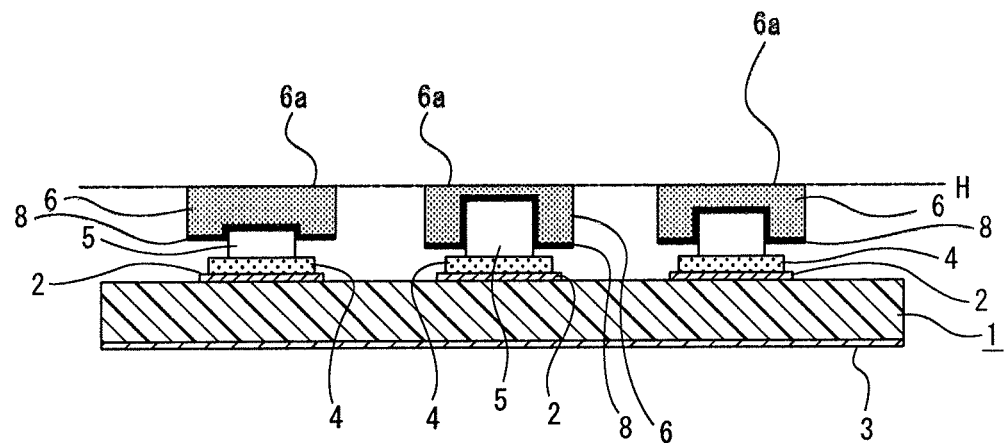
FIG. 18 is an enlarged cross-sectional diagram showing a state in which the first pressure applied to the organic films by the compressing head heater has been released.

By applying the first pressure P1 to the organic films 6, 6, . . . and the strippable films 8, 8, . . . with the compressing head heater 58, the organic films 6, 6, . . . and the strippable films 8, 8, . . . are squashed and deformed so that the heights of the pressed surfaces 6*a*, 6*a*, . . . of the multiple organic films 6, 6, . . . , against which the pressing surface 58*a* is pressed, are equalized (see H shown in FIG. 17 and FIG. 18).

At this time, since the sizes of the lower surfaces of the organic films 6, 6, . . . and strippable films 8, 8, . . . are greater than the sizes of the upper surfaces of the electronic components 5, 5, . . . , at least parts of the side surfaces of the electronic components 5, 5, . . . are covered with respective parts of the organic films 6, 6, . . . and strippable films 8, 8, . . . , in the state in which the organic films 6, 6, . . . and strippable films 8, 8, . . . have been squashed by the compressing head heater 58. In the state in which at least parts of the side surfaces of the electronic components 5, 5, . . . have been covered with the respective parts of the organic films 6, 6, . . . and strippable films 8, 8, . . . , the strippable films 8, 8, . . . cohere to the side surfaces of the electronic components 5, 5, . . . and the organic films 6, 6, . . . do not cohere to the side surfaces of the electronic components 5, 5, . . . .

Figure 19:
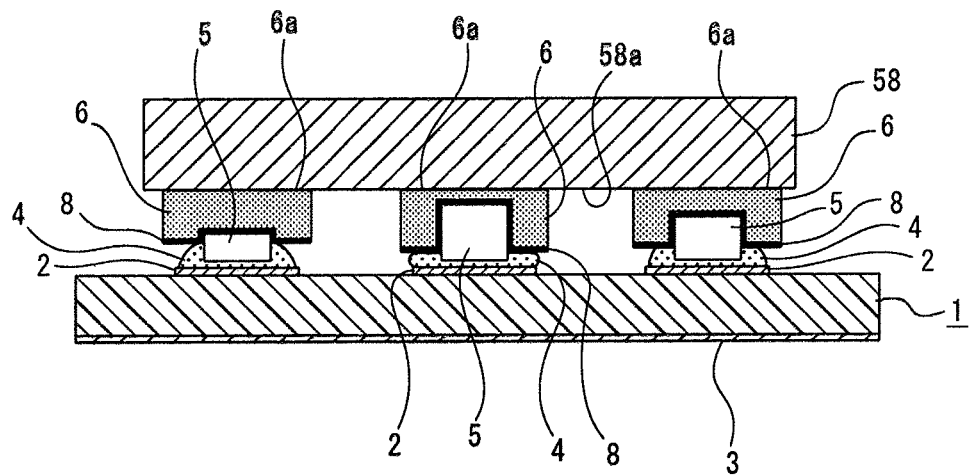
FIG. 19 is an enlarged cross-sectional diagram showing the bonding step.

Subsequently, the bonding step is performed so that the electrode terminals of the electronic components 5, 5, . . . are bonded to the electrodes 2, 2, . . . of the substrate 1, respectively (see FIG. 19).

Figure 20:
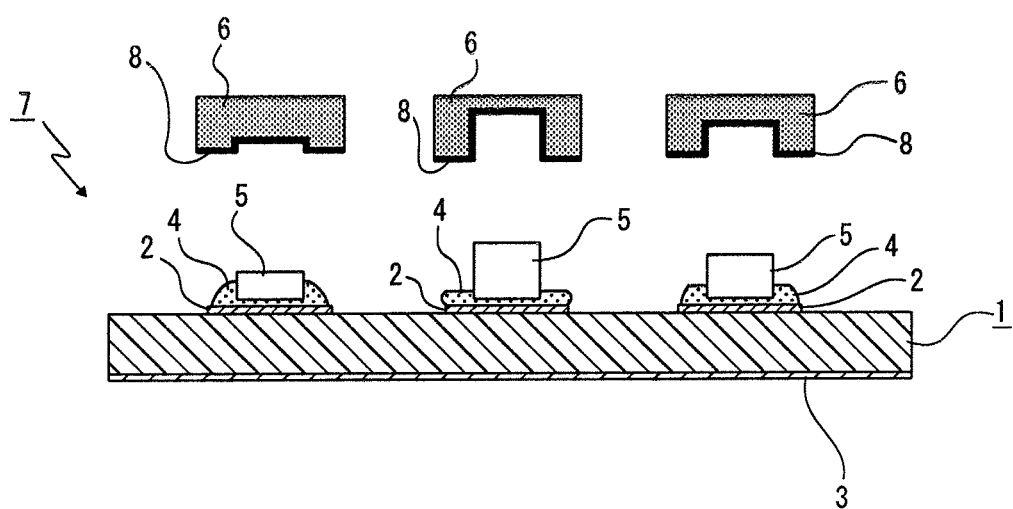
FIG. 20 is an enlarged cross-sectional diagram showing the stripping step.

Next, the stripping step is performed (see FIG. 20). In the stripping step, the organic films 6, 6, . . . and strippable films 8, 8, . . . squashed by the compressing head heater 58 are stripped from the electronic components 5, 5, . . . , respectively.

At this time, since the strippable films 8, 8, . . . , which are metal films or films of polyimide or the like having a higher strippable property for the electronic components 5, 5, . . . than the organic films 6, 6, . . . , cohere to the electronic components 5, 5, . . . , it is possible to strip the organic films 6, 6, . . . from the electronic components 5, 5, . . . easily and surely, and it is possible to increase the ease of operation in the stripping step, leading to an achievement of an increase in productivity.

Further, it is possible to surely avoid the influence of impurities, gas and the like that can be generated from the organic films 6, 6, . . . , on the electronic components 5, 5, . . . , and to ensure a good driving state of the electronic components 5, 5, . . . .

In addition, the strippable films 8, 8, . . . make it possible to block impurities, gas and the like that can be generated from the organic films 6, 6, . . . , and to avoid the influence of the organic films 6, 6, . . . on the electronic components 5, 5, . . . also during the operation in the above respective steps.

As described above, the respective steps are performed, and thereby the bonding of the electronic components 5, 5, . . . to the substrate 1 is completed so that the circuit substrate 7 is formed.

Here, an example in which the strippable films 8, 8, . . . are placed on the upper surfaces of the electronic components 5, 5, . . . respectively has been described above, but, for example, when the electronic components 5, 5, . . . at adjacent positions have the same height, or when the height difference is small, a single strippable film 8 may be placed across the multiple electronic components 5, 5, . . . .

SUMMARY

In the bonding method for the electronic components 5, 5, . . . , as described above, in the state in which the heights of the pressed surfaces 6a, 6a, . . . of the multiple organic films 6, 6, . . . have been equalized, the heating and the compressing are performed by the compressing head heater 58, and the metal fine powder pastes 4, 4, . . . are sintered so that the electrode terminals of the multiple electronic components 5, 5, . . . are bonded to the electrodes 2, 2, . . . of the substrate 1, respectively.

Accordingly, by the one-time heating and compressing in the compressing step, the electrode terminals of the multiple electronic components 5, 5, . . . are bonded to the electrodes 2, 2, . . . of the substrate 1, respectively. Therefore, the time for the diffusion reaction of the metal fine powder pastes 4, 4, . . . is shortened as a whole, and advanced controls such as the adjustment of the parallelisms of the electronic components 5, 5, . . . are not required. Also, even when the distance between the electronic components 5, 5, . . . is short, the electrode terminals of the multiple electronic components 5, 5, . . . are bonded to the electrodes 2, 2, . . . of the substrate 1, respectively, and it is possible to ensure a good bonding state between the electrode terminals of the electronic components 5, 5, . . . and the electrodes 2, 2, . . . of the substrate 1, and achieve an increase in productivity and a downsizing of the substrate 1.

Further, even when the positions and heights of the electronic components 5, 5, . . . are altered, it is possible to use the above bonding method and achieve an increase in versatility.
<Addition>
Although an example in which the electrode terminal of the electronic component 5 is bonded to the electrode 2 of the substrate 1 has been described above, the present invention can be applied to a wide range of fields, for example, a so-called chip-on-chip in which semiconductor chips (electronic components) are bonded to each other as a composite component, a mounted substrate (circuit substrate) for the electrode bonding and others in a semiconductor package or the like, or a semiconductor device.

What is claimed is:

1. An electronic component bonding method comprising:
an applying step of applying a metal fine powder paste on each of multiple electrodes that are provided on a substrate;
a component placing step of placing multiple electronic components in positional alignment with the multiple electrodes respectively, the multiple electronic components including at least two electronic components that have different heights;
an organic film placing step of placing an organic film on the multiple electronic components, the organic film having a thickness greater than a height difference between the highest electronic component and the lowest electronic component of the multiple electronic components;
an organic film compressing step of pressing a pressing surface of a pressing member against the organic film, applying a first pressure to the electronic component side with the pressing member, and equalizing a height of a pressed surface of the organic film, the pressing surface having a planar shape, the pressing member being heated to a predetermined temperature, the pressed surface being pressed by the pressing surface; and
a bonding step of pressing a compressing surface of a compressing member against the pressed surface, applying a second pressure to the electronic component side with the compressing member on heating for a predetermined time, and sintering the metal fine powder paste to bond electrode terminals of the multiple electronic components to the electrodes of the substrate respectively, the compressing surface having a planar shape.

2. The electronic component bonding method according to claim 1 comprising, as a post-step of the bonding step,
a stripping step of detaching the compressing member and stripping the organic film from the multiple electronic components.

3. The electronic component bonding method according to claim 2 comprising, between the component placing step and the organic film placing step,
a strippable film placing step of placing a strippable film on the multiple electronic components,
wherein the organic film is placed on the multiple electronic components through the strippable film.

4. The electronic component bonding method according to claim 1,
wherein a contacting surface of the organic film with the electronic component is larger than a contacting surface of the electronic component with the organic film, and
when the first pressure is applied with the pressing member in the organic film compressing step, at least part of a side surface of the electronic component is covered with the organic film, and therewith part of the metal fine powder paste is pressed by the organic film.

5. The electronic component bonding method according to claim 1,
wherein the organic film is composed of a first layer and a second layer that is positioned closer to the electronic component than the first layer, and
a glass transition point of the first layer is higher than a glass transition point of the second layer.

6. The electronic component bonding method according to claim 1, wherein at least part of the pressing member is formed of a transparent material, an ultraviolet curable film is used as the organic film, and in the organic film compressing step, the organic film is irradiated with ultraviolet rays by transmission through the pressing member so that the organic film is cured.

7. The electronic component bonding method according to claim 1, wherein the pressing member is used as the compressing member, and the pressing surface is used as the compressing surface.

8. The electronic component bonding method according to claim 2, wherein the organic film is composed of a first layer and a second layer that is positioned closer to the electronic component than the first layer, and a glass transition point of the first layer is higher than a glass transition point of the second layer.

9. The electronic component bonding method according to claim 2, wherein at least part of the pressing member is formed of a transparent material, an ultraviolet curable film is used as the organic film, and in the organic film compressing step, the organic film is irradiated with ultraviolet rays by transmission through the pressing member so that the organic film is cured.

10. The electronic component bonding method according to claim 2, wherein the pressing member is used as the compressing member, and the pressing surface is used as the compressing surface.

11. The electronic component bonding method according to claim 3, wherein the organic film is composed of a first layer and a second layer that is positioned closer to the electronic component than the first layer, and a glass transition point of the first layer is higher than a glass transition point of the second layer.

12. The electronic component bonding method according to claim 3, wherein at least part of the pressing member is formed of a transparent material, an ultraviolet curable film is used as the organic film, and in the organic film compressing step, the organic film is irradiated with ultraviolet rays by transmission through the pressing member so that the organic film is cured.

13. The electronic component bonding method according to claim 3, wherein the pressing member is used as the compressing member, and the pressing surface is used as the compressing surface.

* * * * *